US010720520B2

(12) United States Patent
Park et al.

(10) Patent No.: US 10,720,520 B2
(45) Date of Patent: Jul. 21, 2020

(54) METHOD OF CONTROLLING WAFER BOW IN A TYPE III-V SEMICONDUCTOR DEVICE

(71) Applicant: Infineon Technologies Austria AG, Villach (AT)

(72) Inventors: Seong-Eun Park, Chandler, AZ (US); Jianwei Wan, Chandler, AZ (US); Mihir Tungare, Gilbert, AZ (US); Peter Kim, Chandler, AZ (US); Srinivasan Kannan, Chandler, AZ (US)

(73) Assignee: Infineon Technologies Austria AG, Villach (AT)

( * ) Notice: Subject to any disclaimer, the term of this patent is extended or adjusted under 35 U.S.C. 154(b) by 64 days.

(21) Appl. No.: 15/628,723

(22) Filed: Jun. 21, 2017

(65) Prior Publication Data

US 2018/0374941 A1  Dec. 27, 2018

(51) Int. Cl.
*H01L 27/14* (2006.01)
*H01L 29/778* (2006.01)
(Continued)

(52) U.S. Cl.
CPC ........ *H01L 29/778* (2013.01); *H01L 21/0242* (2013.01); *H01L 21/0254* (2013.01);
(Continued)

(58) Field of Classification Search
CPC ....... H01L 29/15–158; H01L 21/02658; H01L 21/02458; H01L 21/02381;
(Continued)

(56) References Cited

U.S. PATENT DOCUMENTS

| 8,362,503 B2* | 1/2013 | Saxler | ..................... | H01L 29/15 |
| | | | | 257/96 |
| 8,765,510 B2* | 7/2014 | Lochtefeld | ........ | H01L 21/02381 |
| | | | | 438/47 |

(Continued)

FOREIGN PATENT DOCUMENTS

| EP | 2469583 A2 | 6/2012 |
| EP | 2869333 A1 | 5/2015 |
| WO | 2015042199 A1 | 3/2015 |

OTHER PUBLICATIONS

Arslan, Engin et al., "Buffer Optimization for Crack-free GaN Epitaxial Layers Grown on Si(111) Substrate by MOCVD", Journal of Physics D: Applied Physics, vol. 41, Jul. 18, 2008, p. 1-10.
(Continued)

*Primary Examiner* — Mary A Wilczewski
*Assistant Examiner* — Tsz K Chiu
(74) *Attorney, Agent, or Firm* — Murphy, Bilak & Homiller, PLLC

(57) ABSTRACT

A type IV semiconductor substrate having a main surface is provided. A type III-V semiconductor channel region that includes a two-dimensional carrier gas is formed over the type IV semiconductor substrate. A type III-V semiconductor lattice transition region that is configured to alleviate mechanical stress arising from lattice mismatch is formed between the type IV semiconductor substrate and the type III-V semiconductor channel region. Forming the type III-V semiconductor lattice transition region includes forming a first lattice transition layer having a first metallic concentration over the type IV semiconductor substrate, forming a third lattice transition layer having a third metallic concentration that is higher than the first metallic concentration over the first lattice transition layer, and forming a fourth lattice transition layer having a fourth metallic concentration (Continued)

that is lower than the first metallic concentration over the third lattice transition layer.

3 Claims, 3 Drawing Sheets

(51) Int. Cl.
*H01L 21/02* (2006.01)
*H01L 29/267* (2006.01)
*H01L 29/20* (2006.01)

(52) U.S. Cl.
CPC .. *H01L 21/02378* (2013.01); *H01L 21/02381* (2013.01); *H01L 21/02458* (2013.01); *H01L 21/02505* (2013.01); *H01L 29/267* (2013.01); *H01L 29/2003* (2013.01); *H01L 29/7786* (2013.01)

(58) Field of Classification Search
CPC ........... H01L 21/02642; H01L 21/0254; H01L 21/0251; H01L 21/02507; H01L 21/02505
See application file for complete search history.

(56) References Cited

U.S. PATENT DOCUMENTS

| | | | |
|---|---|---|---|
| 8,957,454 B2* | 2/2015 | Briere | H01L 21/0237 257/194 |
| 9,537,054 B2* | 1/2017 | Billingsley | H01L 33/32 |
| 9,818,826 B2* | 11/2017 | Shatalov | H01L 21/0242 |
| 10,192,959 B2* | 1/2019 | Zhao | H01L 21/02507 |
| 10,355,120 B2* | 7/2019 | Odnoblyudov | H01L 21/0245 |
| 2004/0119063 A1* | 6/2004 | Guo | C30B 29/68 257/13 |
| 2008/0217645 A1* | 9/2008 | Saxler | H01L 21/02381 257/101 |
| 2012/0223365 A1* | 9/2012 | Briere | H01L 21/0237 257/194 |
| 2013/0026486 A1 | 1/2013 | Miyoshi et al. | |
| 2013/0200495 A1 | 8/2013 | Keller et al. | |
| 2018/0212025 A1* | 7/2018 | Zhao | H01L 29/152 |

OTHER PUBLICATIONS

Dadgar, A, "MOVPE Growth of GaN on Si(111) Substrates", Journal of Crystal Growth, vol. 248, 2003, pp. 556-562.
Ma, Jun et al., "Improved GaN-based LED Grown on Silicon (111) Substrates Using Stress/Dislocation-engineered Interlayers", Journal of Crystal Growth, vol. 370, 2013, pp. 256-268.
Dadgar, A., et al., "Gallium-nitride-based devices on silicon", Physica Status Solidi (C), vol. 0, No. 6, Mar. 4, 2003, 1940-1949.
Charles, Matthew, et al., "Developments in understanding the nucleation of AlN on silicon by MOCVD and its effects on defects", Physica Status Solidi A 214, No. 4, Nov. 14, 2016, 1-6.
Kandaswamy, Prem Kumar, et al., "AlN/AlGaN/GaN buffer optimization on silicon (111): bow and crystal quality control for Si-CMOS fabs", Physica Status Solidi C 11, No. 3-4, Feb. 17, 2014, 450-453.

* cited by examiner

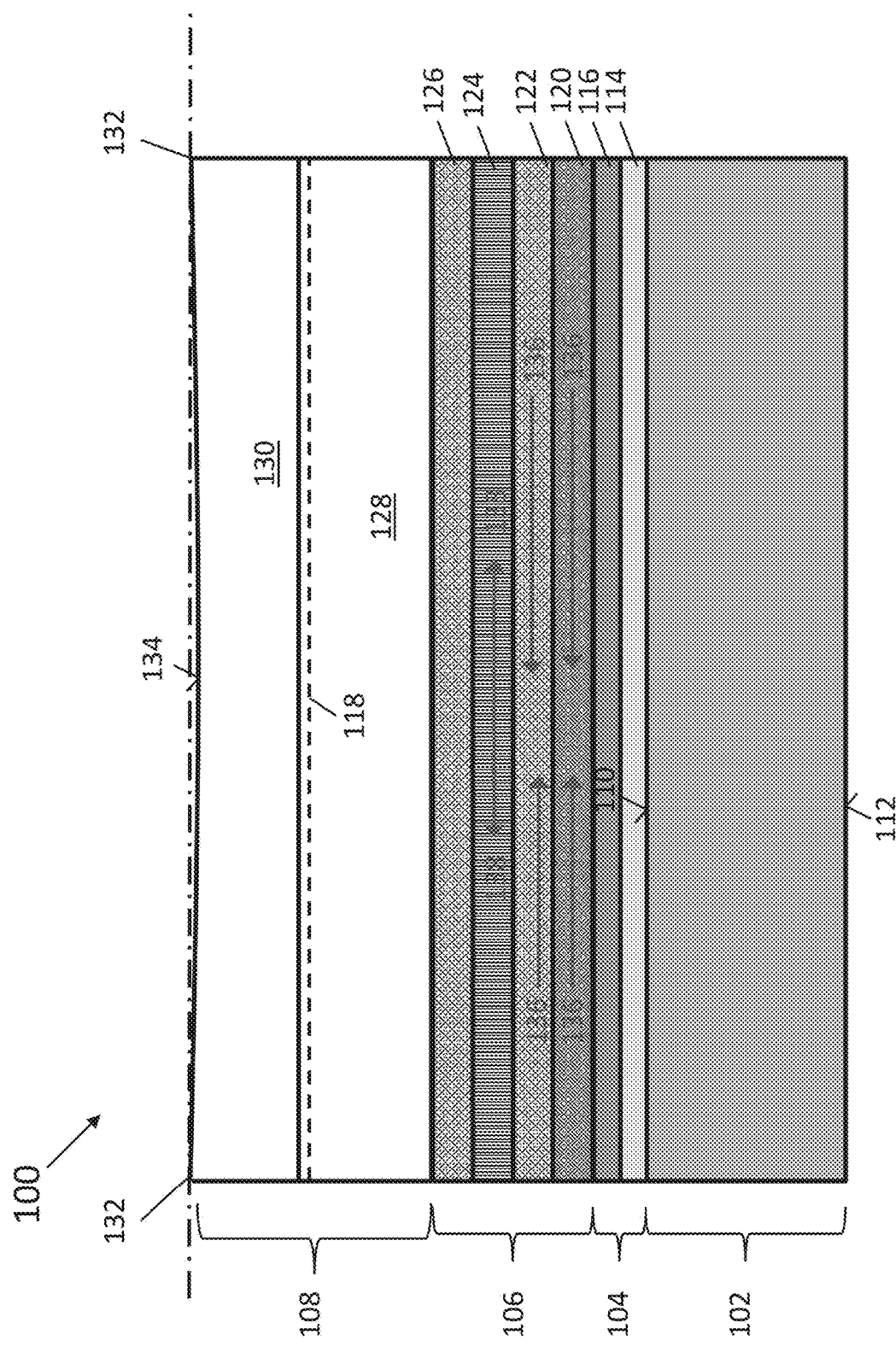

METHOD OF CONTROLLING WAFER BOW IN A TYPE III-V SEMICONDUCTOR DEVICE

TECHNICAL FIELD

The instant application relates to semiconductor devices, and in particular relates to techniques for forming type III-V semiconductor material for high-electron-mobility semiconductor devices.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN.

HEMTs are viewed as an attractive candidate for power transistor applications, i.e., applications in which switching of substantially large voltages and/or currents is required. HEMTs offer high conduction and low resistive losses in comparison to conventional silicon based devices.

HEMTs are commonly formed from III-V semiconductor materials, such as GaN, GaAs, InGaN, AlGaN, etc. In a GaN/AlGaN based HEMT, a two-dimensional electron gas (2DEG) arises at the interface between the AlGaN barrier layer and the GaN buffer layer. The 2DEG forms the channel of the device instead of a doped region, which forms the channel in a conventional MOSFET device. Similar principles may be utilized to select buffer and barrier layers that form a two-dimensional hole gas (2DHG) as the channel of the device. A 2DEG or a 2DHG is generally referred to as a two-dimensional carrier gas. Without further measures, the heterojunction configuration leads to a self-conducting, i.e., normally-on, transistor. Measures must be taken to prevent the channel region of an HEMT from being in a conductive state in the absence of a positive gate voltage.

One technique for forming the type III-V semiconductors used in HEMTs involves using a using a silicon wafer as a base substrate and epitaxially growing type III-V semiconductor material on the silicon wafer base substrate. Silicon wafers are widely available within the industry and thus provide a cost-effective platform for epitaxially growing type III-V semiconductor material.

One issue related to III-V semiconductor epitaxial formation relates to wafer bowing. Wafer bowing refers to a convex or concave shaped warpage of the completed device. That is, an upper surface of the device is curved instead of planar. One source of wafer bow relates to the processes and materials used to form the III-V semiconductor layers. Typically, type III-V semiconductor layers are formed on a silicon base wafer using a high temperature (e.g., 600° C. to 1000° C.) epitaxial deposition process. The epitaxial deposition is followed by a cooling cycle. These thermal cycles cause the materials to expand and contract. This expansion and contraction can be problematic, particularly when materials having different coefficients of thermal expansion are used. An example of this is the above described device in which the silicon substrate has a different coefficient of thermal expansion as the III-V semiconductor layers that are formed on the silicon substrate. As the device cools, mechanical stress (e.g., compressive stress and tensile stress) arises in the device, which causes the device to bow. This bowing can cause cracks to propagate in the finalized device. This issue can harm device performance and/or detrimentally impact yield.

SUMMARY

A method of forming a type III-V semiconductor device is disclosed. According to an embodiment of the method, a type IV semiconductor substrate having a main surface is provided. A type III-V semiconductor channel region is formed over the type IV semiconductor substrate. The type III-V semiconductor channel region includes a two-dimensional carrier gas. A type III-V semiconductor lattice transition region is formed between the type IV semiconductor substrate and the type III-V semiconductor channel region. The type III-V semiconductor lattice transition region is configured to alleviate mechanical stress arising from lattice mismatch between the type IV semiconductor substrate and the type III-V semiconductor channel region. Forming the type III-V semiconductor lattice transition region includes forming a first lattice transition layer over the type IV semiconductor substrate, the first lattice transition layer having a first metallic concentration, forming a third lattice transition layer over the first lattice transition layer, the third lattice transition layer having a third metallic concentration that is higher than the first metallic concentration, and forming a fourth lattice transition layer over the third lattice transition layer, the fourth lattice transition layer having a fourth metallic concentration that is lower than the first metallic concentration.

According to another embodiment of the method, a type IV semiconductor substrate having a main surface is provided. A type III-V semiconductor channel region is formed over the type IV semiconductor substrate. The type III-V semiconductor channel region includes a two-dimensional carrier gas. A type III-V semiconductor lattice transition region is formed between the type IV semiconductor substrate and the type III-V semiconductor channel region. The type III-V semiconductor lattice transition region is configured to alleviate mechanical stress arising from lattice mismatch between the type IV semiconductor substrate and the type III-V semiconductor channel region. A nucleation layer that includes a metal nitride is formed between the type IV semiconductor substrate and the type III-V semiconductor lattice transition region. A process parameter for forming the nucleation layer is controlled as to reduce a substrate bow of the type III-V semiconductor device.

A type III-V semiconductor device is disclosed. According to an embodiment, the type III-V semiconductor device includes a type IV semiconductor substrate having a main surface. A type III-V semiconductor lattice transition region is formed over the main surface of the semiconductor substrate. A type III-V semiconductor channel region is formed over the type III-V semiconductor lattice transition region. The type III-V semiconductor channel region includes a two-dimensional carrier gas. The type III-V semiconductor lattice transition region is electrically inactive and is configured to alleviate lattice mismatch between the type IV semiconductor substrate and the type III-V semiconductor channel region. The type III-V semiconductor lattice transition region includes a first lattice transition layer formed over the type IV semiconductor substrate, the first lattice transition layer having a first metallic concentration, a third lattice transition layer formed over the first lattice transition layer, the third lattice transition layer having a third metallic concentration that is higher than the first metallic concentration, and a fourth lattice transition layer formed over the third lattice transition layer, the fourth lattice transition layer having a fourth metallic concentration that is lower than the first metallic concentration.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 3 illustrates a substantially reduced wafer bow in the type III-V semiconductor device due to the control of certain manufacturing process parameters, according to an embodiment.

DETAILED DESCRIPTION

According to embodiments described herein, a method for controlling wafer bow in a type III-V semiconductor device is described. The method generally applies to any type III-V semiconductor device formation process that includes the following steps: (1) providing a type IV semiconductor substrate, (2) forming a metal nitride nucleation layer directly on the surface type IV semiconductor substrate and (3) epitaxially forming an electrically inactive type III-V semiconductor lattice transition region over the semiconductor substrate.

The inventors have extensively studied the various contributors to wafer bow in the above described type III-V semiconductor formation process and identified techniques that can be used to substantially reduce or even eliminate wafer bow. For example, one technique involves the provision of an intermediate layer in the lattice transition region, i.e., a layer with at least one lattice transition layer above it and at least one lattice transition layer beneath it, with a metallic concentration that is higher than the immediately subjacent layer or layers of the lattice transition region. This configuration departs from conventionally known lattice transition structures, which employ a gradually decreasing metallic concentration of the type III-V semiconductor lattice transition layers with increasing distance from the type IV semiconductor substrate. The inventors have discovered that such an intermediate transition layer can be used to counteract the mechanical stressors responsible for wafer bow. Parameters for forming the intermediate transition layer, e.g., metallic concentration, epitaxial deposition time, etc., can be controlled in such a way to partially or completely compensate for the mechanical stressors in subjacent layers responsible for wafer bow, resulting in a completed device with reduced or eliminated wafer bow. In addition, another technique involves controlling the parameters for forming the nucleation layer, e.g., epitaxial deposition temperature, annealing and nitridation temperature, etc. The inventors have identified a correlation between these parameters and the wafer bow of the completed device that can be characterized and controlled to reduce or even eliminate wafer bow for a given material combination.

Figure 1:
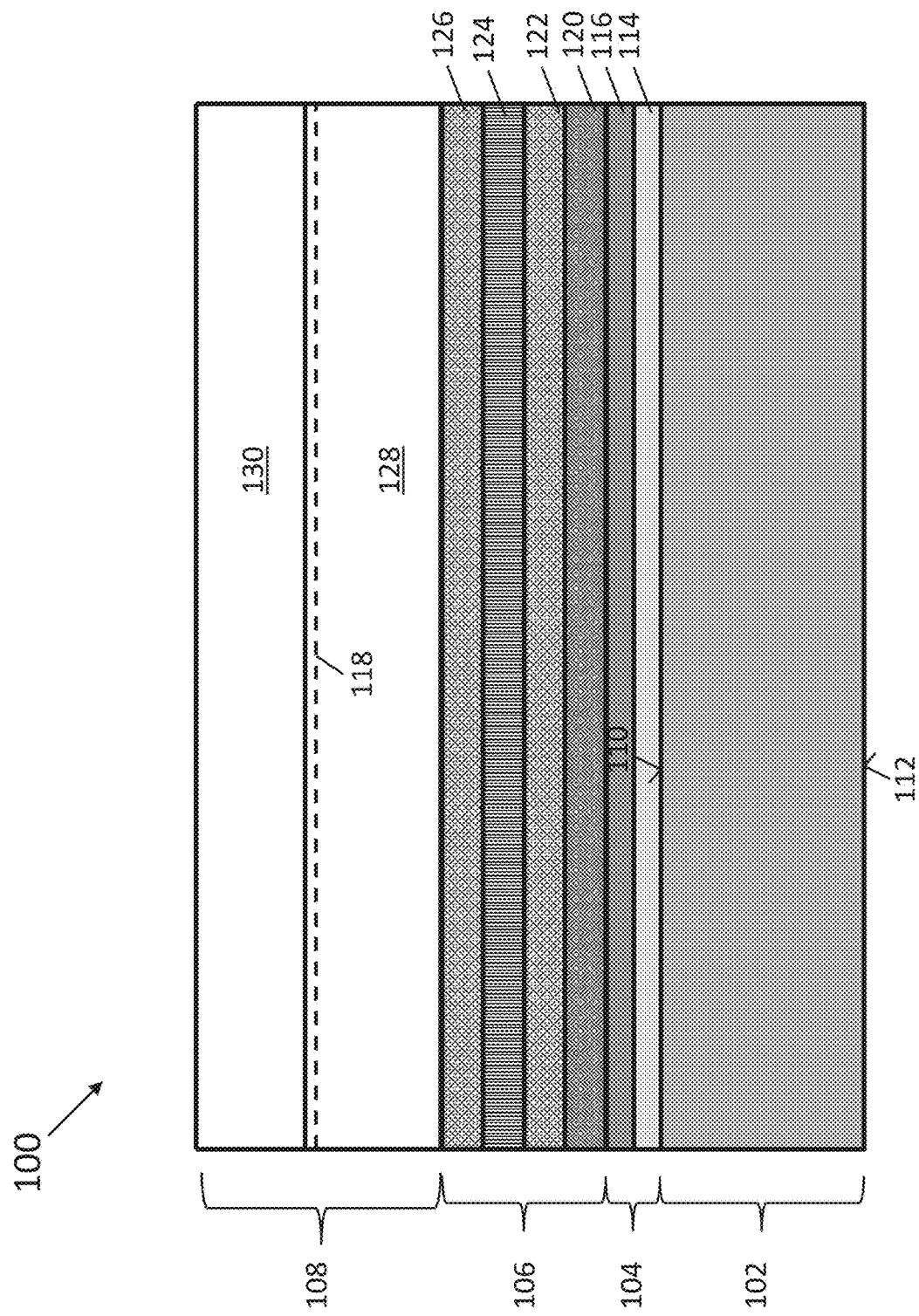
FIG. 1 illustrates a type III-V semiconductor device, according to an embodiment.

Referring to FIG. 1, a type III-V semiconductor device 100 is depicted, according to an embodiment. The type III-V semiconductor device 100 includes a type IV semiconductor substrate 102, a metal nitride nucleation layer 104 formed over the type IV semiconductor substrate 102, a type III-V semiconductor lattice transition region 106 formed over the nucleation layer 104, and a type III-V semiconductor channel region 108 formed over type III-V semiconductor transition region 106.

The type IV semiconductor substrate 102 includes a main surface 110 and a rear surface 112 that is opposite to the main surface 110. The type IV semiconductor substrate 102 can include any type IV semiconductor material suitable for manufacturing semiconductor devices. Exemplary materials for the semiconductor substrate include silicon (Si), group IV compound semiconductor materials such as sapphire ($Al_2O_3$), silicon carbide (SiC) or silicon germanium (SiGe).

The metal nitride nucleation layer 104 can be formed directly on the main surface 110 of the type IV semiconductor substrate. Generally speaking, the nucleation layer 104 can include any material that is conducive to epitaxial growth of type III-V semiconductor nitride material thereon, as direct epitaxial growth of type III-V semiconductor material such as GaN on type IV semiconductor material such as silicon is typically not possible. According to one embodiment, the nucleation layer 104 includes aluminum nitride (AlN). The thickness of the nucleation layer 104 can vary anywhere between 50 nm (nanometers) and 1 μm (micrometer), for example. The nucleation layer 104 can include a single layer of metal nitride. Alternatively, the nucleation layer 104 can be a compound semiconductor layer having multiple layers of different composition. For example, in the depicted embodiment, the nucleation layer 104 includes a first low temperature layer 114 and a second high temperature layer 116. These two layers are formed according to different process parameters, which will be described in further detail below, and as a result differ by at least one physical attribute, e.g., thickness, nitride concentration, etc. Optionally, one or more doped type III-V semiconductor nitride layer or layers (not shown) can be interposed between the various metal nitride layers.

The type III-V semiconductor lattice transition region 106 can be formed directly on the nucleation layer 104. The type III-V semiconductor lattice transition region 106 is configured to alleviate mechanical stress arising from lattice mismatch between the type IV semiconductor substrate 102 and the type III-V semiconductor channel region 108. Because the type IV semiconductor substrate 102 is formed from a different crystalline material than the type III-V semiconductor channel region 108 (e.g., silicon vs. GaN/AlGaN), the underlying lattice constant of the material in these two regions is different. This difference in lattice constant causes mechanical stress, which makes it difficult to grow defect free epitaxial layers and can detrimentally impact electrical performance of the conducting regions of the device. The type III-V semiconductor lattice transition region 106 provides a physical intermediary between the type IV semiconductor substrate 102 and the type III-V semiconductor channel region 108 that gradually distributes and alleviates this mechanical stress. Thus, the top of the type III-V semiconductor lattice transition layer is more suitable for the formation of a substantially stress free and defect free type III-V semiconductor nitride thereon than the top of the nucleation region. The type III-V semiconductor lattice transition region 106 is an electrically inactive region.

That is, the type III-V semiconductor lattice transition region 106 does not include a conductive channel that contributes to the electrical functionality of the device. Moreover, with the exception of parasitic and/or non-ideal effects, the type III-V semiconductor lattice transition region 106 does not alter the electrical properties of the two-dimensional charge carrier gas 118 of the type III-V semiconductor channel region 108.

The type III-V semiconductor lattice transition region 106 can include a number of type III-V semiconductor layers with a metallic concentration. For example, the type III-V semiconductor lattice transition region 106 can include a number of AlGaN layers. The physical properties of each type III-V semiconductor layer, e.g., thickness, metallic concentration, etc., differs from at least an immediately adjacent type III-V semiconductor layer in at least one aspect. In the depicted embodiment, the type III-V semiconductor lattice transition region 106 includes a first type III-V semiconductor lattice transition layer 120 that is formed directly on the nucleation layer 104, a second type III-V semiconductor lattice transition layer 122 that is formed directly on the first type III-V semiconductor lattice transition layer 120, a third type III-V semiconductor lattice transition layer 124 that is formed directly on the second type III-V semiconductor lattice transition layer 122, and a fourth type III-V semiconductor lattice transition layer 126 that is formed directly on the third type III-V semiconductor lattice transition layer 124. The first type III-V semiconductor lattice transition layer 120 has a first metallic concentration. The second type III-V semiconductor lattice transition layer 122 has a second metallic concentration that is different from the first metallic concentration. The third type III-V semiconductor lattice transition layer 124 has a third metallic concentration that is different from the second metallic concentration. The fourth type III-V semiconductor lattice transition layer 124 has a fourth metallic concentration that is different from the third metallic concentration. More generally, the type III-V semiconductor lattice transition region 106 can include any number of lattice transition layers greater than three, e.g., four, five, six, etc. Generally speaking, the metallic concentration of these lattice transition layers may be anything greater than 0 percent and less than 100 percent. Moreover, generally speaking, the thicknesses of the of the lattice transition layers may vary from 50 nm to several μm, for example. Specific examples of metallic concentrations and thicknesses of the lattice transition layers, as well as the process parameters for forming these lattice transition layers, will be described in further detail below.

The type III-V semiconductor channel region 108 can be formed directly on the type III-V semiconductor lattice transition region 106. According to an embodiment, the type III-V semiconductor channel region 108 includes a buffer layer 128 and a barrier layer 130. The buffer layer 128 can be formed directly on the type III-V semiconductor lattice transition region 106 and the barrier layer 130 can be formed directly on the buffer layer 128. The buffer layer 128 can be an intrinsic layer of pure or essentially pure GaN. Alternatively, the buffer layer 128 can be a layer of AlGaN with a very low Al content (e.g., ≤10%). The buffer layer 128 can in addition or in the alternative include other dopant atoms (e.g., carbon or iron). The barrier layer 130 includes a type III-V semiconductor material with a metallic concentration. For example, the barrier layer 130 can be a layer of AlGaN. More generally, the buffer layer 128 can include any type III-V semiconductor material such as gallium nitride (GaN), gallium arsenide (GaAs), aluminium nitride (AlN), aluminium arsenide (AlAs), indium nitride (InN), indium arsenide (InAs), etc. The buffer layer 128 can also include ternary or quarternary type III-V semiconductor materials such as aluminium gallium nitride (AlGaN), aluminium gallium arsenide (AlGaAs), indium gallium nitride (InGaN), indium aluminium gallium nitride (InAlGaN), etc. Likewise, the barrier layer 130 can include any type III-V semiconductor material such as gallium nitride (GaN), gallium arsenide (GaAs), aluminium nitride (AlN), aluminium arsenide (AlAs), indium nitride (InN), indium arsenide (InAs), etc. The barrier layer 130 can also include ternary or quarternary type III-V semiconductor materials such as aluminium gallium nitride (AlGaN), aluminium gallium arsenide (AlGaAs), indium gallium nitride (InGaN), indium aluminium gallium nitride (InAlGaN), etc.

Due to a difference in bandgap between the buffer layer 128 and the barrier layer 130, a two-dimensional charge carrier gas 118 forms near the interface between the buffer and barrier layers 128, 130. This two-dimensional charge carrier gas 118 provides an electrically active channel for the type III-V semiconductor device 100. A gate structure (not shown) and electrically conductive contacts (not shown) such as source contacts, drain contacts, anode contacts, cathode contacts, etc. may be formed in the type III-V semiconductor device 100 and used to control a conduction state of the two-dimensional charge carrier gas 118 in a conventionally known manner.

The type III-V semiconductor device 100 can be formed according to the following methods. Initially, the type IV semiconductor substrate 102 is provided. The type IV semiconductor substrate 102 can be provided from a commercially available semiconductor wafer. That is, the type IV semiconductor substrate 102 is not necessarily formed in a common fabrication process with the layers formed thereon. Subsequently, the nucleation layer 104 is formed on the main surface 110 of the semiconductor substrate. The nucleation layer 104 can be formed using a deposition technique, for example. More particularly, the various layers of the nucleation layer 104 can be formed according to a two-step process. Initially, a metal (e.g., aluminum) is deposited on the main surface 110 of the type IV semiconductor substrate. This can be done according to any of a variety of techniques, such as physical vapor deposition (PVD), chemical vapor deposition (CVD), sputtering, etc. This metal deposition can occur at elevated temperatures in the range of 850° C. to 1200° C., for example. Subsequently, and annealing and nitridation step is performed whereby the deposited metal is exposed to a nitride agent, e.g., nitrogen. This nitridation can occur at elevated temperatures in the range of 500° C. to 1300° C., for example. After forming the nucleation layer 104, the type III-V semiconductor lattice transition region 106 is formed on the nucleation layer 104. The type III-V semiconductor lattice transition region 106 can be formed using an epitaxial deposition technique, for example. An example of such a technique is a metalorganic vapor phase epitaxy (MOCVD) process. Each of the various layers of the type III-V semiconductor lattice transition region 106 can be formed by sequential, discrete epitaxy processes, i.e., periods of epitaxial deposition at elevated temperatures followed by cooling. In this way, the thickness and metallic concentration of the first, second, third and fourth lattice transition layers 120, 122, 124, 126 is controllable by separate epitaxial deposition processes. Subsequently, the type III-V semiconductor channel region 108 is formed on the type III-V semiconductor lattice transition region 106. The type III-V semiconductor channel region 108 can be formed by an epitaxial deposition technique, for example.

Figure 2:
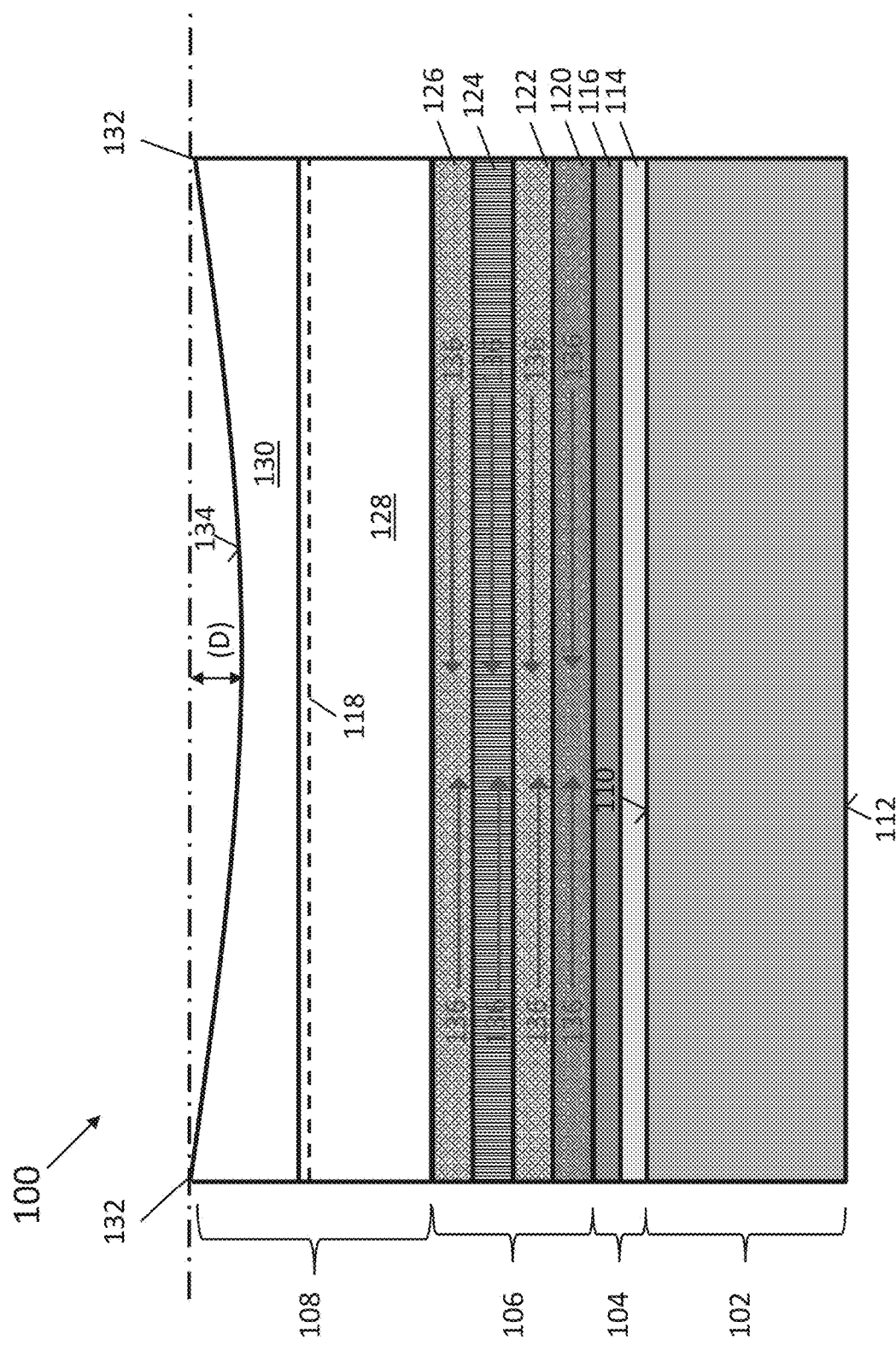
FIG. 2 illustrates wafer bow that occurs from the manufacture of the type III-V semiconductor device, according to an embodiment.

Referring to FIG. 2, a type III-V semiconductor device 100 with significant wafer bow is depicted, according to an embodiment. The wafer bow refers to a distance (D) between outer corners 132 of the upper surface 134 of the type III-V semiconductor device 100 and a location on the upper surface 134 of the type III-V semiconductor device 100 that is maximally vertically deflected, i.e., offset, from the outer corners 132 of the type III-V semiconductor device 100. In the depicted embodiment, the type III-V semiconductor device 100 has a so-called convex wafer bow wherein the upper surface 134 of the type III-V semiconductor device 100 curves downward towards the type IV semiconductor substrate 102. Alternatively, depending on the materials selected and processes parameters used to form the device, the type III-V semiconductor device 100 can have a so-called concave wafer bow wherein the upper surface 134 of the type III-V semiconductor device 100 curves upwards away from the type IV semiconductor substrate 102. The techniques for mitigating wafer bow described herein are equally applicable to convex wafer bow and concave wafer bow.

The wafer bow illustrated in FIG. 2 is at least partially attributable to the following phenomena. The epitaxy processes used to form the type III-V semiconductor layers require high temperatures, e.g., temperatures in the range of 600° C. to 1200° C. The material of the type IV semiconductor substrate 102 (e.g., Si) has a different coefficient of thermal expansion than the material of the type III-V semiconductor lattice transition region 106 (e.g., AlGaN) as well as the material of the type III-V semiconductor channel region 108 (e.g., GaN and AlGaN). Thus, as the device cools, the type III-V semiconductor material and the type IV semiconductor material contract at different rates. This contraction produces a mechanical stress in the device. In the depicted example, the transition layers of the transition region experience a compressive stress 136, i.e., a force that tends to push the lattice transition layers 120, 122, 124, 126 inwards in the depicted direction. This compressive stress 136 can propagate through the each one of the lattice transition layers 120, 122, 124, 126, and can compound across multiple ones of the lattice transition layers 120, 122, 124, 126. As a result, the type III-V semiconductor channel region 108 tends to form unevenly in the depicted manner.

Referring to FIG. 3, a type III-V semiconductor device 100 with substantially reduced wafer bow in comparison to the device described with reference to FIG. 2 is depicted, according to an embodiment. The inventors have extensively studied the issue of wafer bow and identified a number of parameters that are correlated to this phenomenon. By appropriately controlling these parameters, the wafer bow (either concave or convex) as described above can be reduced or even substantially eliminated.

According to one embodiment, process parameters for forming one or more layers of the type III-V semiconductor lattice transition region 106 are controlled to reduce wafer bow. The general parameters for forming a device in this manner are as follows. The first type III-V semiconductor lattice transition layer 120 is formed with a first metallic concentration. The second type III-V lattice transition layer 122 is formed with a second metallic concentration that is lower than the first metallic concentration. The third type III-V semiconductor lattice transition layer 124 is formed with a third metallic concentration that is higher than the second metallic concentration, and may be higher than the first metallic concentration as well. The fourth type III-V semiconductor lattice transition layer 126 is formed with a fourth metallic concentration that is lower than the second metallic concentration. The metallic concentration of these layers refers to the percentage by volume of metallic elements in the material, relative to the semiconductor elements. For example, in the case of AlGaN, the metallic concentration refers to the percentage of aluminum relative to GaN. According to one embodiment, in numerical terms, the first, second, third and fourth metallic concentrations can be anywhere between 0 and 100%, and the third metallic concentration can be anywhere between 60% and 100%, provided that the first, second third and fourth metallic concentrations conform to the relative relationships described above.

The above described general parameters of the type III-V semiconductor lattice transition region 106 depart from conventional lattice transition structures with respect to the composition of the third type III-V semiconductor lattice transition layer 124. Conventionally, lattice transition structures are configured such that the metallic concentration of the material gradually decreases as it moves away from the type IV semiconductor substrate 102 and towards the type III-V semiconductor channel region 108. In the presently disclosed device, the third type III-V semiconductor lattice transition layer 124 does not follow this trend, as it has a higher metallic concentration than the immediately subjacent lattice transition layer, i.e., the second type III-V lattice transition layer 122. In fact, according to some embodiments, the second type III-V lattice transition layer 122 has the highest metallic concentration of any layer in the type III-V semiconductor lattice transition region 106.

By providing the third type III-V semiconductor lattice transition layer 124 with a higher metallic concentration than the immediately subjacent layer, the third type III-V semiconductor lattice transition layer 124 can be configured to produce a tensile stress 138, i.e., a force that tends to push the third type III-V semiconductor lattice transition layer 124 outward in the depicted direction, on adjacent semiconductor layers. This tensile stress 138 counteracts the compressive stress 136 exerted by the subjacent semiconductor layers (e.g., the first and second type III-V lattice transition layers 120, 122 in the depicted embodiment). By appropriately controlling the parameters for forming the third type III-V semiconductor lattice transition layer 124, the third type III-V semiconductor lattice transition layer 124 can produce a tensile stress 138 that substantially completely compensates for the compressive stress 136 generated by the immediately subjacent layers. As a result, the wafer bow phenomena described with reference to FIG. 2 can be substantially eliminated.

According to one embodiment, wafer bow is reduced or eliminated by controlling the epitaxial deposition time, and hence the thickness, of the third type III-V semiconductor lattice transition layer 124. An exemplary device which illustrates this principle has the following characteristics. The device includes a first type III-V semiconductor lattice transition layer 120 with an aluminium concentration of between about 60% and 80% and a thickness of between about 200 nm and 1 μm, a second type III-V lattice transition layer 122 with an aluminium concentration of between about 50% and 70% and thickness of between about 200 nm and 1 μm, and a fourth lattice transition region layer with an aluminium concentration of between about 30% and 50% and thickness of between about 800 nm and 1 μm. Using this device, the inventors experimentally compared the results for three different epitaxial growth times (and hence three different thicknesses) for a third type III-V semiconductor lattice transition layer 124 having an aluminium concentration higher than 60%. For an epitaxial growth time of 250 seconds, an average wafer bow −33 μm (concave) was observed across six samples. For an epitaxial growth time of 265 seconds, an average wafer bow of −13 μm (concave) was observed across six samples. For an epitaxial growth time of 268 seconds (which corresponds to a thickness of about 100 nm for the second type III-V lattice transition layer 122), an average wafer bow of −3 μm (concave) was observed for six samples. This trend extrapolates to a change in wafer bow of about 1.7 μm per second of epitaxial growth time for the third type III-V semiconductor lattice transition layer 124 with the specific device measured. Thus, the parameter of epitaxial growth time for the third type III-V semiconductor lattice transition layer 124 was isolated as an independent process parameter that can be used to shift the wafer bow of the type III-V semiconductor device 100 in a desired direction, and can be used to eliminate or mitigate wafer bow.

More generally, the above described wafer bow mitigation technique is applicable to any type III-V semiconductor device 100 containing at least three lattice transition layers being formed on a type IV semiconductor substrate 102, with an intermediate lattice transition layer (i.e., a lattice transition layer with at least one lattice transition layer disposed above it and at least one lattice transition layer disposed beneath it) having a higher metallic concentration than the subjacent lattice transition layer. Depending on various parameters, such as layer thicknesses, epitaxy temperature, metallic concentration of the various lattice transition layers, for example, the exact wafer bows observed and rate of reduction in wafer bow per second of epitaxial growth for the intermediate lattice transition layer may vary. In any of these devices, the correlation between epitaxial growth time for the intermediate lattice transition layer and wafer bow can be extrapolated so that the epitaxial growth time of the intermediate lattice transition layer can be controlled to mitigate wafer bow.

According to another embodiment, wafer bow is reduced or eliminated by controlling the process parameters for forming the nucleation layer 104. The inventors have identified certain process parameters for forming the nucleation layer 104 that are correlated to the wafer bow as described with reference to FIG. 2. An exemplary device which illustrates this principle has the following characteristics. The device includes a type IV semiconductor substrate 102, a metal nitride nucleation layer 104 formed on the main surface 110 of the type IV semiconductor substrate 102, and a type III-V semiconductor lattice transition region 106 formed on the nucleation layer 104. In contrast to the above example, the type III-V semiconductor lattice transition region 106 may have a gradually decreasing metallic content. A type III-V semiconductor channel region 108 is formed on the type III-V semiconductor lattice transition region 106.

The inventors have identified that, in the above described device, any one or both of the epitaxial deposition or annealing and nitridation steps for forming the the nucleation layer 104 are correlated to wafer bow, and thus can be controlled to reduce wafer bow. More particularly, the inventors experimentally compared the results for different temperate ranges for both of the epitaxial deposition or annealing and nitridation steps for forming the the nucleation layer 104. In one example, the temperature for the annealing, and nitridation steps for forming the first low temperature layer 114 of the nucleation layer 104 was varied between 959° C. and 963° C., and the change in wafer bow was observed. Across this range, average wafer bow was observed to be approximately −5.5 μm at 959° C. and approximately −0.5 μm at 963° C. This trend extrapolates to a reduction in wafer bow of about 1.4 μm per degree (C) for the annealing and nitridation step for forming the first low temperature layer 114. In another example, the temperature of the epitaxial deposition step for forming the first low temperature layer 114 was varied between 938° C. and 942° C., and the change in wafer bow was observed. Across this range, average wafer bow was observed to be approximately −5.5 μm at 938° C. and approximately −0.5 μm at 942° C. This trend extrapolates to a reduction in wafer bow of about 1.4 μm per degree (C) for the epitaxial deposition step for forming the first low temperature layer 114.

More generally, the above described wafer bow technique is applicable to any type III-V semiconductor device 100 containing a a type IV semiconductor substrate 102, a metal nitride nucleation layer 104 formed directly on the type IV semiconductor substrate 102, and type III-V semiconductor material grown on the metal nitride nucleation layer 104. Depending on various parameters, such as layer thicknesses, material composition, metallic concentration of the type IV semiconductor substrate 102, the nucleation layer 104 or the type III-V semiconductor material grown on the metal nitride nucleation layer 104, the exact wafer bows observed and rate of reduction in wafer bow as a function of temperature in the epitaxial deposition or annealing and nitridation of the metal nitride nucleation layer 104 may vary. In any of these devices, the correlation between temperature of epitaxial deposition or annealing and nitridation of the metal nitride nucleation layer 104 and wafer bow can be extrapolated in such a manner so as to reduce or substantially eliminate wafer bow by appropriately tailoring the process to the particular device.

The above described method of controlling wafer bow by controlling the process parameters of for forming the type III-V semiconductor lattice transition region 106 can optionally be combined with the above described method of controlling wafer bow by controlling the process parameters for forming the nucleation layer 104. That is, the two methods are not mutually exclusive. Nonetheless, either technique can be independently employed to substantially reduce or completely eliminate wafer bow.

The term "substantially eliminated" as used in this specification when referring to wafer bow describes a process whereby average wafer bow as measured across multiple manufactured semiconductor devices is no greater than 1 μm.

The term "process parameter" as used in this specification refers to a quantity that can be varied, e.g., thickness, time, dopant density, etc. as part of a semiconductor manufacturing process, e.g., deposition, nitridation, etc., and this variation leads to a different material property of the resulting structure.

The term "controlling" as used in this specification when referring to the control of a process parameter refers to the selection of a process parameter value based upon a known relationship between this process parameter and a physical outcome of the completed device. For example, the specification discloses a relationship between the epitaxial growth time of the third type III-V semiconductor lattice transition layer 124 and overall wafer bow. A method that "controls" the epitaxial growth time of the third type III-V semiconductor lattice transition layer 124 sets the epitaxial growth time of the third type III-V semiconductor lattice transition layer 124 to be dependent upon the desired wafer bow (or lack thereof) based upon this relationship.

The term "power semiconductor device" as used in this specification intends to describe a semiconductor device on a single chip with high voltage and/or high current switching capabilities. In other words, power semiconductor devices are intended for high current, typically in the range of one or more Amperes and/or high voltages, typically above 100 V, more typically above 400 V.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel. For example, GaN may be combined with AlGaN or InGaN to form an electron gas inversion region as the channel. The compound semiconductor device may have AlInN/AlN/GaN barrier/spacer/buffer layer structures.

In general, III-V semiconductor materials, such as GaN, are used to form high electron mobility semiconductor devices according to the embodiments described herein. With GaN technology, the presence of polarization charges and strain effects result in the realization of a two-dimensional charge carrier gas which is a two-dimensional electron or hole inversion layer characterized by very high carrier density and carrier mobility. Such a two-dimensional charge carrier gas such as a 2DEG (two-dimensional electron gas) or 2DHG (two-dimensional hole gas) forms the channel region of the device. A thin, e.g. 1-2 nm, AlN layer can be provided between the GaN buffer layer and the alloy barrier layer to minimize alloy scattering and enhance 2DEG mobility. Other combinations of III-V semiconductor materials can be used in order to form a 2DEG or 2DHG channel region, as is well known in the art. In general, any heterostructure can be used where a band discontinuity is responsible for the device concept. For example, with an AlGaAs system there is no piezoelectric effect, but a confinement concept which involves arranging quantum wells for confinement of the channel region is possible.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method of forming a type III-V semiconductor device, the method comprising:
providing a type IV semiconductor substrate comprising a main surface;
forming a type III-V semiconductor channel region over the type IV semiconductor substrate, the type III-V semiconductor channel region comprising a two-dimensional carrier gas,
forming a type III-V semiconductor lattice transition region between the type IV semiconductor substrate and the type III-V semiconductor channel region, the type III-V semiconductor lattice transition region being configured to alleviate mechanical stress arising from lattice mismatch between the type IV semiconductor substrate and the type III-V semiconductor channel region;
forming a nucleation layer that comprises a metal nitride between the type IV semiconductor substrate and the type III-V semiconductor lattice transition region; and
controlling a process parameter for forming the nucleation layer so as to reduce a substrate bow of the type III-V semiconductor device wherein the process parameter for forming the nucleation layer comprises at least one of: an annealing and nitridation step for forming the nucleation layer, and an epitaxial deposition step for forming the nucleation layer, wherein forming the nucleation layer comprises forming a first low temperature layer and forming a second high temperature layer, wherein the annealing and nitridation step for forming the first low temperature layer as well as the epitaxial deposition step for forming the first low temperature layer are performed at a temperature of between 850° C. and 1200° C., and wherein the annealing and nitridation step for forming the second high temperature layer as well as the epitaxial deposition step for forming the second high temperature layer are performed at a temperature of above 1200° C.

2. The method of claim 1, wherein controlling the process parameter for forming the nucleation layer comprises controlling the temperature of the annealing and nitridation step for forming the first low temperature layer.

3. The method of claim 1, wherein controlling the process parameter for forming the nucleation layer comprises controlling the temperature of the epitaxial deposition step for forming the first low temperature layer.

* * * * *